(12) United States Patent
Greywall

(10) Patent No.: US 6,545,796 B1
(45) Date of Patent: Apr. 8, 2003

(54) ARTICLE COMPRISING A FREESTANDING MICRO-TUBE AND METHOD THEREFOR

(75) Inventor: Dennis S. Greywall, Whitehouse Station, NJ (US)

(73) Assignees: Agere Systems Inc., Allentown, PA (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/660,952

(22) Filed: Sep. 13, 2000

(51) Int. Cl.[7] .............................................. G02B 26/00

(52) U.S. Cl. ....................... 359/291; 359/321

(58) Field of Search ................. 359/291, 290, 359/321; 73/514.18

(56) References Cited

U.S. PATENT DOCUMENTS

| | | | | |
|---|---|---|---|---|
| 5,645,684 A | * | 7/1997 | Keller | 148/33.2 |
| 5,673,139 A | | 9/1997 | Johnson | |
| 5,920,417 A | | 7/1999 | Johnson | |
| 6,051,441 A | * | 4/2000 | McDowell et al. | 257/427 |
| 6,199,874 B1 | * | 3/2001 | Galvin et al. | 280/5.514 |
| 6,319,789 B1 | * | 11/2001 | Carstensen | 430/316 |

* cited by examiner

Primary Examiner—Georgia Epps
Assistant Examiner—Richard Hanig

(57) ABSTRACT

A free-standing hollow micro-tube that provides, in some embodiments, a flexible support for a movable platform. The hollow micro-tube is actuated to flex at substantially lower voltages than solid supports. Consequently, articles incorporating the micro-tubes that may be actuated by electrostatic forces, such as an XY translation stage and an array of pedestal mirrors, operate at reduced voltages.

21 Claims, 15 Drawing Sheets

ARTICLE COMPRISING A FREESTANDING MICRO-TUBE AND METHOD THEREFOR

FIELD OF THE INVENTION

The present invention relates generally to microelectromechanical systems ("MEMS") devices. More particularly, the present invention relates to a flexible support element for use in MEMS devices and to articles incorporating the flexible support element.

BACKGROUND OF THE INVENTION

MEMS technology is becoming ubiquitous. MEMS accelerometers, pressure sensors, optical modulators, display devices and even MEMS-based electrical components have been developed for use in a wide variety of applications.

MEMS devices often incorporate structural elements (e.g., plates, etc.) that are supported for movement or that otherwise require separation from other structures in a MEMS device. In some MEMS devices, movable structural elements are supported by support arms that are disposed at the periphery thereof. In other MEMS devices, pedestals that are disposed beneath the structural element provide support therefor.

In U.S. Pat. Nos. 5,673,139 and 5,920,417 ("the '139 and the '417 patents), a MEMS-based television scanning device is described. The device includes a cross-shaped plate having an electrically-conductive material that is supported above four actuator electrodes by a flexible joint. One actuator electrode is disposed underneath each arm of the cross-shaped plate. On application of a voltage to an electrode, an attractive force is induced between the actuated electrode and the overlying arm of the cross-shaped plate. As a consequence, the overlying arm moves towards the actuated electrode.

In one embodiment described in the '139 and the '417 patents, the "flexible joint" is a "flexible shaft" in the form of a solid rod or tube (see, e.g., FIG. 8 of either patent showing a cross sectional view of the shaft "32"). To create even a relatively minor amount of flexion in a solid "flexible" shaft requires an undesirably high voltage. In the '139 and '417 patents, the overlying cross-shaped plate itself can flex towards the electrode, so the degree of flexibility of the flexible shaft is not at issue. But in other applications, it is desirable to have a shaft that provides substantially all required flexion to effectuate movement of an overlying plate.

SUMMARY OF THE INVENTION

In accordance with the present teachings, an article comprising a free-standing, hollow micro-tube is disclosed.

The micro-tube, which has a diameter on the order of tens of microns, is typically "free standing" (i.e., supported at only one end thereof). The other end of the micro-tube usually supports a platform or some other structure.

The micro-tube is formed from a cylindrical wall. In some embodiments, the cylindrical wall is created by forming a hole through a substrate material, depositing a material along the perimeter of the hole (ie., on the surface of the surrounding substrate material), and then removing the surrounding material. By virtue of its hollow constitution, the micro-tube offers less resistance to flexing or bending than a solid support structure. Such reduced resistance is particularly advantageous for devices comprising structures that are designed to bend under the action of an applied voltage, since lower bending resistance equates to a lower voltage requirement.

In one specific embodiment of an article comprising a micro-tube, the article is an XY-translation stage. An illustrative XY translation stage includes several electrodes and a platform supported by four micro-tubes. As voltage is applied across a select one or more of the electrodes, an electrostatic force is generated between the stage and the actuated electrode(s). Consequently, the platform moves towards the actuated electrode(s).

In a second specific embodiment of an article comprising a micro-tube, the article is an array of pedestal mirrors. An illustrative pedestal mirror has a reflective platform—a mirror—supported by one micro-tube. Several electrodes are disposed underneath the mirror. As voltage is applied across a select one or more of the electrodes, the mirror "tilts" towards the actuated electrode(s). Moving the mirror in such fashion allows, for example, an optical signal to be selectively directed to any one of several possible destinations (e.g., different waveguides). The array includes a plurality of pedestal mirrors, each of which mirrors are advantageously independently addressable. In one embodiment, the array of pedestal mirrors is used as an optical cross connect in an optical communications system.

DETAILED DESCRIPTION OF THE INVENTION

Figure 1A:
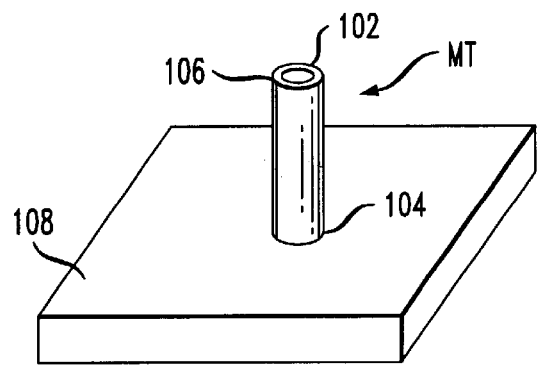
FIG. 1A depicts a micro-tube in accordance with the present teachings.

FIG. 1A depicts a free standing, thin-walled micro-tube MT in accordance with the present teachings. The term "micro-tube," as used herein, refers to a tube having a diameter on the order of tens of microns. In most embodiments, the present micro-tube is "free standing," meaning that it is supported only at one end thereof. For example, in the illustrative embodiment, micro-tube MT is supported at end 104, where it depends from a substrate or base 108. Typically, the other end 106 of microtube MT supports a platform (not shown) or some other structure.

Figure 1B:
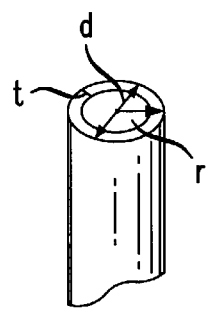
FIG. 1B depicts a portion of the micro-tube of FIG. 1A.

Micro-tube MT is defined by cylindrical wall 102. Micro-tube MT is hollow; that is, thickness t of wall 102 is less than radius r of the micro-tube (see FIG. 1B). By virtue of its hollow constitution, micro-tube MT offers less resistance to flexing or bending than a solid support. Such reduced resistance is particularly advantageous for devices comprising structures that are designed to bend under the action of an applied voltage, since lower bending resistance equates to a lower activation voltage.

The resistance of micro-tube MT to bending is a function of thickness t of wall 102, among other factors. Typically, thickness t will be in the range of about 1 percent to about 10 percent of the outside diameter d of micro-tube MT. It will be understood that while a wall thickness t falling outside this range is acceptable, flexibility decreases (voltage requirements increase) with increasing wall thickness and wall robustness decreases with decreasing wall thickness.

In some embodiments, wall 102 comprises a material that exhibits substantially no hysteresis. In the present context, that means that if micro-tube MT is deformed, it will return to its initial non-deformed stated. Moreover, the material must be capable of being applied (e.g., deposited, etc.) in a uniform manner so that the wall that ultimately results is smooth and has uniform thickness. Furthermore, the material is advantageously electrically conductive, or capable of being rendered conductive, such as via doping with appropriate dopants. Suitable materials for wall 102 include, without limitation, polysilicon and silicon nitride. In some embodiments, the polysilicon is doped with, for example, boron, arsenic and phosphorous to impart conductivity.

For some applications, it will be acceptable for wall 102 to exhibit hysteresis. For such embodiments, wall 102 comprises, for example, a metal, an alloy or other material that will exhibit hysteresis and exhibits the other properties mentioned above (i.e., uniform thickness on application, etc.).

Micro-tube MT is useful in a variety of applications, a few of which include:
- providing movement to a depending structure;
- functioning to stand-off or separate various structural elements from one another;
- placing physically separate structures in electrical contact; and
- serving as a fluid conduit.

Figure 2:
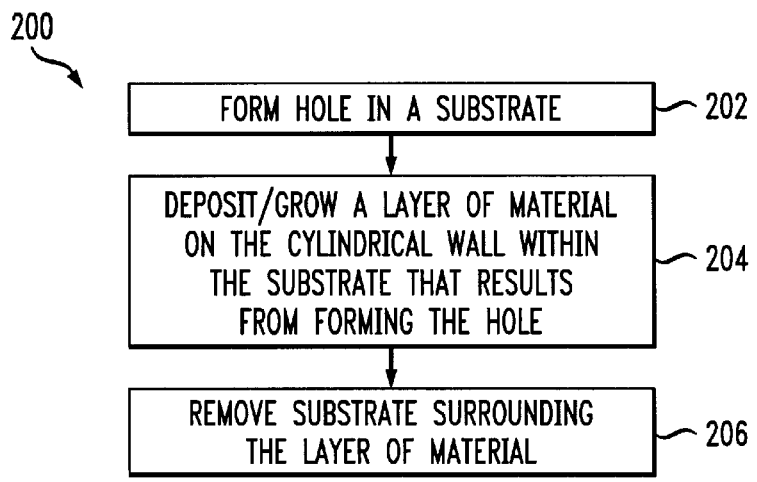
FIG. 2 depicts a method for making the micro-tube of FIG. 1.

FIG. 2 depicts, via flow diagram, illustrative method 200 in accordance with the present invention for fabricating a thin-walled micro-tube. The specifics of micro-tube fabrication will vary from embodiment to embodiment as a function of the specific configuration of the structure that incorporates the micro-tube. Consequently, there may be variation in the order in which the steps of method 200 are carried out. Moreover, additional deposition/patterning/etch steps are usually required to form and release the micro-tube as a function of the surrounding structure. Examples of such variation and additional fabrication steps are provided later in this Specification in the context of several specific structures that incorporate the present micro-tubes. In view of these teachings, those skilled in the art will be able to readily apply the principles of illustrative method 200 as a function of application specifics to fabricate any given structure.

In accordance with operation 202 of method 200, a hole is formed in a substrate. Deep reactive ion etching ("RIE") is advantageously used to form the hole. Deep RIE, which is known to those skilled in the art, is capable of obtaining aspect ratios of as high as about 50:1 (depth/diameter) and diameters as small as about 10 microns. Laser milling may also be used for forming a hole, as appropriate.

The hole formed in operation 202 defines a cylindrical wall within the substrate. In operation 204, the material that forms the wall of the micro-tube is deposited or grown on the cylindrical wall. In embodiments in which polysilicon is used as wall-forming material, it is deposited via chemical vapor deposition techniques in known fashion.

In operation 206, the micro-tube is "released" by removing the substrate that surrounds the structural material that has been deposited in the hole. In embodiments in which the substrate is silicon, it may be removed by an isotropic etchant, such as $XeF_2$.

As described later in this Specification, to the extent that the wall-forming material will etch at a similar rate as the surrounding substrate, an etch-stop must be disposed between the wall-forming material and the substrate. For example, if the wall-forming material is polysilicon, and the substrate is silicon, an etch-stop such as an oxide should be used. In one embodiment, the etch-stop (e.g., oxide, etc.) is grown or deposited on the cylindrical wall that is formed in the substrate (step 204) before depositing/growing the wall-forming material.

Figure 3:
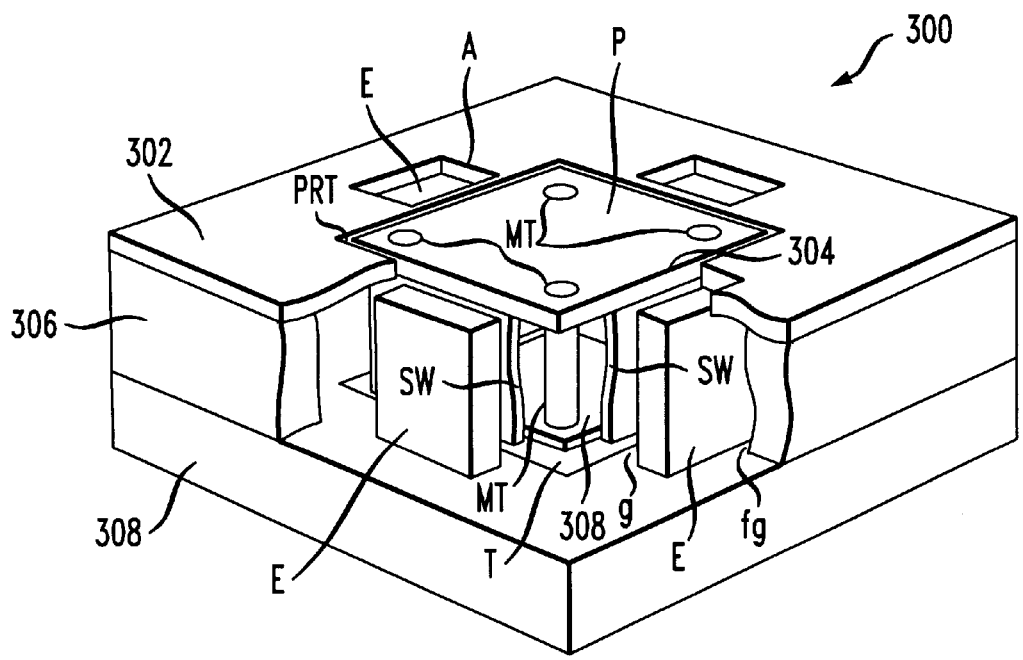
FIG. 3 depicts a perspective cut-away view of an illustrative XY stage incorporating a micro-tube in accordance with the present teachings.
Figure 6:
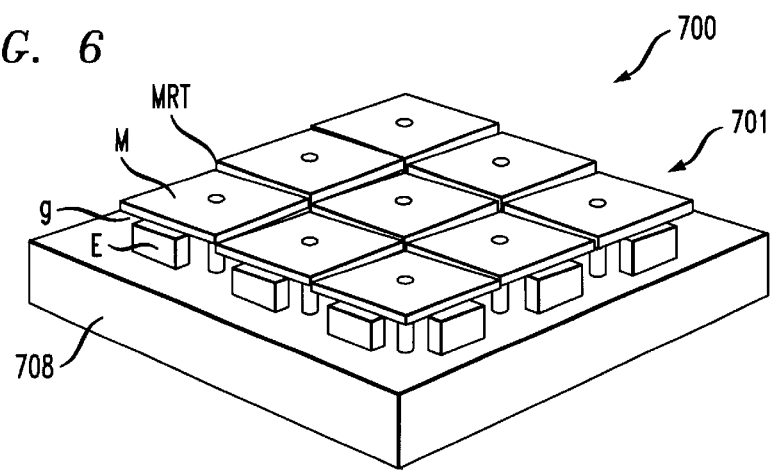
FIG. 6 depicts an illustrative array of tilting pedestal mirrors incorporating micro-tubes in accordance with the present teachings.

FIGS. 3 and 6 depict articles that incorporate the present micro-tube as a structural element. The article depicted in FIG. 3 is a XY translation stage for positioning objects in two dimensions. The article depicted in FIG. 6 is an array of pedestal mirrors, useful for a variety of optics applications. In both of the illustrative articles, the micro-tube functions as a flexible member that allows an overlying platform to move in response to an actuating force.

I. XY Translation Stage
A. Structure and Operation

XY translation stage 300 depicted, via a perspective cut-away view in FIG. 3, includes square platform or stage P that is supported by four micro-tubes MT, one located near each corner of the stage. Micro-tubes MT are anchored in base layer 308.

While depicted as having a square shape, platform P can have virtually any shape, as is suitable for the application or otherwise desired by the fabricator. For example, platform P is circular, triangular and hexagonal in three additional embodiments. Moreover, while in the illustrative embodiment, XY translation stage 300 includes four micro-tubes MT, in other embodiments, more or fewer micro-tubes may suitably be used for supporting platform P. At least one of micro-tubes MT is advantageously grounded to platform P.

Four conductive side-walls SW depend from platform P near perimeter 304 thereof. Side-walls SW project downwardly towards base layer 308. In illustrative XY translation stage 300, the four side-walls SW form a continuous apron. Trench T, which is located beneath side-walls SW, ensures that the side-walls do not contact base layer 308.

Four electrodes E are disposed near sidewalls SW. In illustrative XY translation stage 300, one side of each electrode E is disposed in opposing/facing relation to one of the side-walls SW. Electrode E and side-wall SW of each electrode/sidewall pair are separated by gap g. Electrodes E are electrically insulated from base layer 308 by a layer of electrically-insulating material (not depicted), such as, without limitation, silicon dioxide, etc. Electrodes E are separated by fixed gap or space fg from surrounding intermediate layer 306.

In the illustrated embodiment, access for electrical connection to electrodes E is provided by access-ways A in surface layer 302. Access to the interior space of hollow micro-tubes MT is provided underneath base layer 308. Such space is used, in some embodiments, to electrically connect a controlled voltage source or other signal source (not shown) to a structure (not shown) that is positioned on platform P.

In the illustrated embodiment, platform P is substantially co-extensive or co-planar with surface layer 302. Platform release trench or gap PRT between platform P and surface layer 302 allows for movement of platform P.

In the illustrated embodiment, the support elements (e.g., micro-tubes MT) and actuation elements (e.g., electrodes E and sidewalls SW) of XY translation stage 300 are disposed beneath surface layer 302 within a cavity. As described in further detail below, this subsurface, multi-layer configuration is achieved, in one embodiment, by fabricating XY translation stage 300 using one silicon-on-insulator ("SOI") wafer and one standard silicon wafer. In one embodiment, the thin silicon layer of the SOI wafer serves as surface layer 302, the thick silicon layer of the SOI wafer serves as the intermediate layer 306 and the standard wafer serves as the base layer 308.

In operation of the XY translation stage 300, voltage is applied across at least one electrode E and the opposing side-wall SW. The applied voltage generates an electrostatic force that draws the opposing side-wall SW toward the actuated electrode (i.e., along a single axis). Applying voltage to two adjacent electrodes will cause movement along two axes.

While XY translation stage 300 has four electrodes E, in other embodiments, fewer than four electrodes may suitably be used. For example, in some embodiments wherein movement along only one-axis is required (i.e., so that the stage is a X translation stage or a Y translation stage), two electrodes E and two side-walls SW are used. In fact, reciprocative movement can be effected using only a single side-wall SW and a single electrode E.

B. Displacement as a Function of Applied Voltage

The equilibrium displacement for an XY translation table is determined by equating the electrostatic force (drawing a side-wall SW to a facing electrode E) to the mechanical force that resists the electrostatic force.

Figure 4:
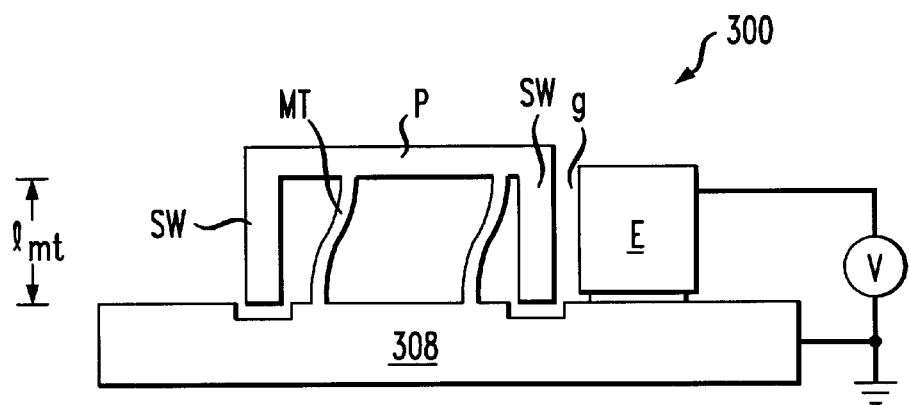
FIG. 4 depicts a figurative cross-sectional view of the illustrative XY stage of FIG. 3.

FIG. 4 depicts a simplified cross-section of XY translation stage 300 wherein two of the XY translation table's four micro-tubes MT, two of the four side-walls SW, and one of the four electrodes E are shown. Micro-tubes MT and electrode E are considered to be equal in height. Sidewall SW and electrode E are separated by gap g. The following quantities are required for calculation:

The height $l_{mt}$, diameter $d_{mt}$ and wall thickness $t_{mt}$ of micro-tube MT;

The area of the face of electrode E that faces side-wall SW, which is given by:

Area=$l_{mt} \times$width $w_e$ of electrode E;

The gap $g_o$ between side-wall SW and electrode E at zero voltage;

The number N of micro-tubes MT;

Young's modulus E, which for silicon is 131 GPa; and $\epsilon_o$=electric permittivity=$8.85 \times 10^{-12} C^2/N\text{-}m^2$.

It is known that the system becomes unstable at $g_o/3$. The voltage, V, required to move the XY translation table a distance of $g_o/3$ is given by:

$$V=[(48/27)(N/4)(\pi E/\epsilon_o)]^{0.5} \times [(t_{mt}d_{mt}^3 g_o^3)/(w_e l_{mt}^4)]^{0.5} \quad [1]$$

Substituting in N=4, as well as the values of E and $\epsilon_o$ provided above, measuring distances in microns, and rearranging, expression [1] becomes:

$$V=[2.88 \times 10^5 / l_{mt}^2] \times [(t_{mt}d_{mt}^3 g_o^3)/(w_e)]^{0.5} \quad [2]$$

For an illustrative case, it is assumed that:

height $l_{mt}$ of the micro-tube is 500 microns;

diameter $d_{mt}$ of the micro-tube is 15 microns;

wall thickness $t_{mt}$ of the micro-tube is 0.5 microns; and width $w_e$ of the electrode is 2000 microns.

Substituting such values, Expression [2] becomes:

$$V=1.1 g_o^{3/2} \quad [3]$$

Assuming that the zero-voltage gap go between the side-wall and the electrode is 15 microns, then voltage V=64 volts. That is, 64 volts is required to shift platform P of XY translation stage 300 a distance of $g_o/3$ or 5 microns.

For comparison, if the micro-tube were solid, then the activation voltage increases by a factor of: $[1/8(d_{mt}/t_{mt})]^{0.5}$ or 1.94. Thus, the hollow micro-tube activation voltage of 64 volts increases to 64×1.94=124 volts for a solid micro-tube.

C. Illustrative Fabrication Method

FIGS. 5B–5N and the accompanying text provide a description of an illustrative fabrication method for XY translation stage 300. The fabrication method is based on method 200 for the fabrication of a micro-tube, as applied in the specific context of an XY translation stage. In the embodiment described below, one SOI wafer and one standard silicon wafer are used for fabrication. The SOI wafer is commercially available from SOITEC USA, Inc. of Peabody, Massachusetts, or others.

A conventional SOI wafer 500 is depicted in FIG. 5. SOI wafer 500 comprises a bulk or "thick" silicon layer 506, an electrically insulating layer 504 disposed thereon, and a "thin" silicon layer 502 that is disposed on insulating layer 504.

Thick silicon layer 506 is commonly referred to as the "handle side" of the SOI wafer. Thick silicon layer 506 has a thickness that is typical for silicon wafers, usually in a range from about 525 microns to about 725 microns as a function of wafer diameter.

Insulating layer 504 is typically an oxide layer (e.g., silicon dioxide). Insulating layer 504 is commonly referred to as a "buried" oxide layer or "BOX" layer, since it is sandwiched between the two silicon layers. Insulating layer 504 has a thickness that typically falls in a range of about 0.2 to 3 microns, as desired. Thin silicon layer 502 has a thickness that is in the range of about 0.1 to 10 microns, as desired.

An illustrative method for fabricating XY translation table 300 from a SOI wafer and a standard silicon wafer is now described with reference to FIGS. 5B–5N. The illustrative fabrication method utilizes standard etching, doping and photolithographic techniques. As such techniques are commonplace in the art, they will be referenced without explanation.

Figure 5A:
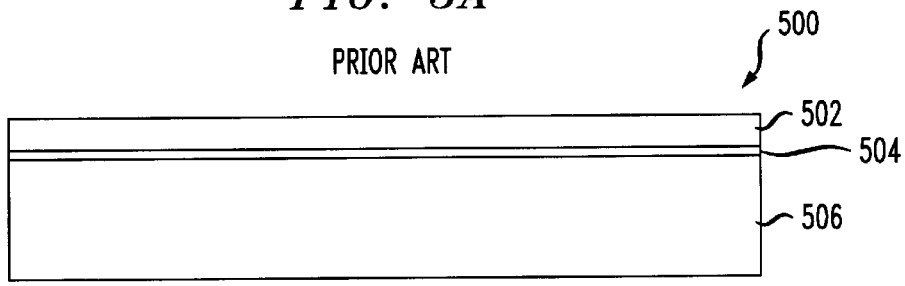
FIG. 5 depicts a conventional silicon-on-insulator wafer.
FIGS. 5B–5N depict stages in the fabrication of the illustrative XY stage of FIG. 3.
Figure 5B:
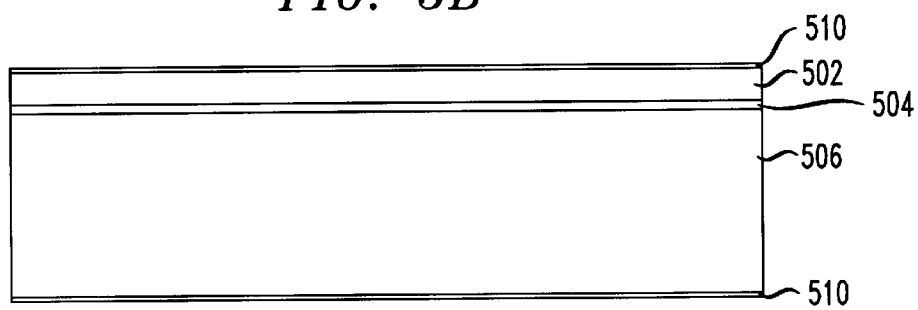

Oxide layer 510 is grown or deposited on thin silicon layer 502 and handle portion 506, as depicted in FIG. 5B. The thickness of oxide layer 510 is not critical except that it must be thick enough to function as an etch-stop; a layer thickness in a range of about 0.2 to about 2 microns is suitable.

Figure 5C:
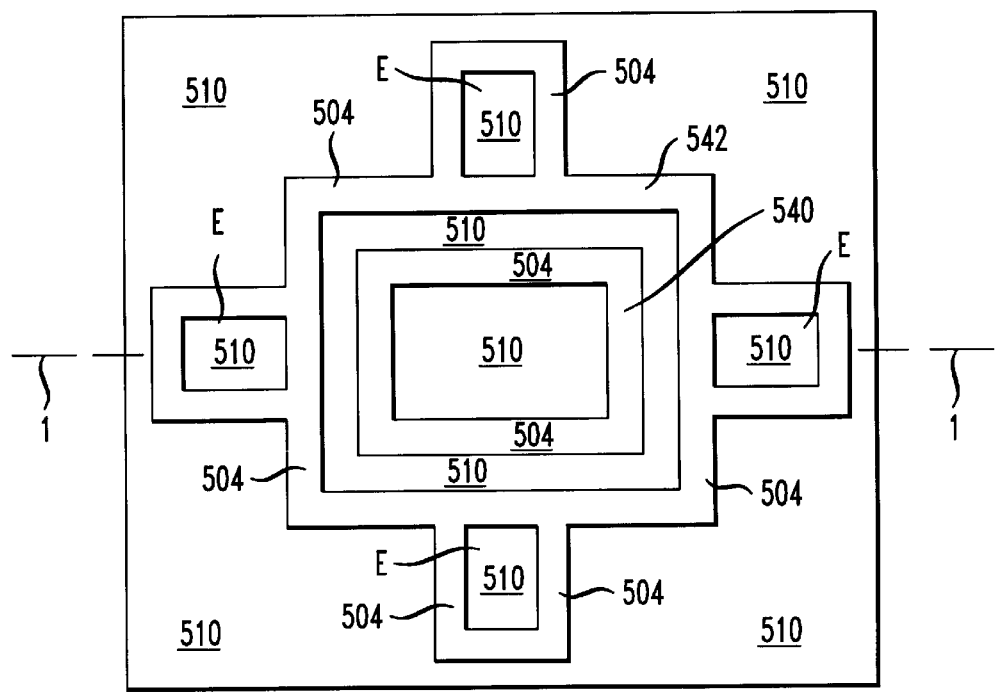
Figure 5D:
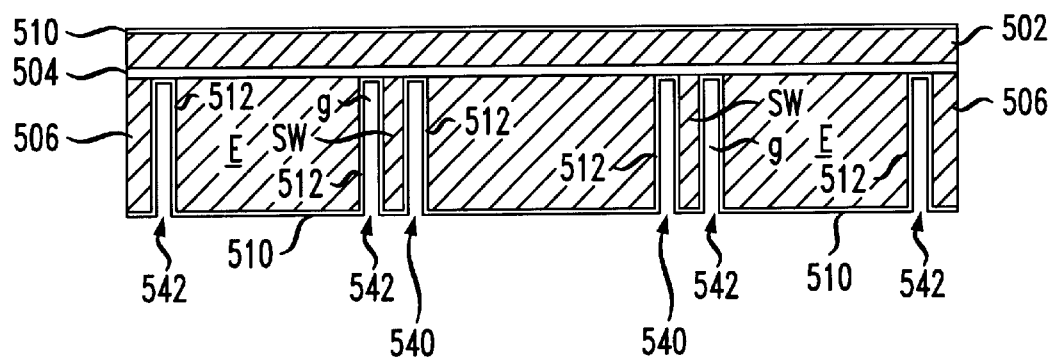

Next, oxide layer 510 on the handle side of wafer 500 is patterned and etched as depicted in FIG. 5C. In particular, inner trench 540 is etched down to BOX 504. Outer trench 542 is also etched down to BOX 504. FIG. 5D depicts a cross section of wafer 500 through line 1—1 of FIG. 5C (the FIG. 5D cross section is not to the scale of FIG. 5C) after an oxide layer 512 is grown/deposited on the sides of trenches 540 and 542.

As depicted in FIGS. 5C and 5D, trenches 540 and 542 define several features of the XY translation table 300, including, for example, side-walls SW (see FIG. 3, side-walls SW), electrodes E (see FIG. 3, electrodes E) and gap g between electrodes E and side-walls SW.

Figure 5E:
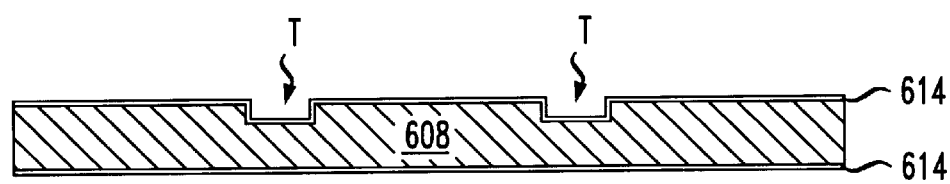

A standard wafer 608, which is depicted in FIG. 5E, is patterned and etched to create clearance trenches T that will ultimately be located beneath the sidewalls SW (see FIG. 3, trench T). After clearance trenches T are formed, oxide 614 is grown/deposited on wafer 608.

Figure 5F:
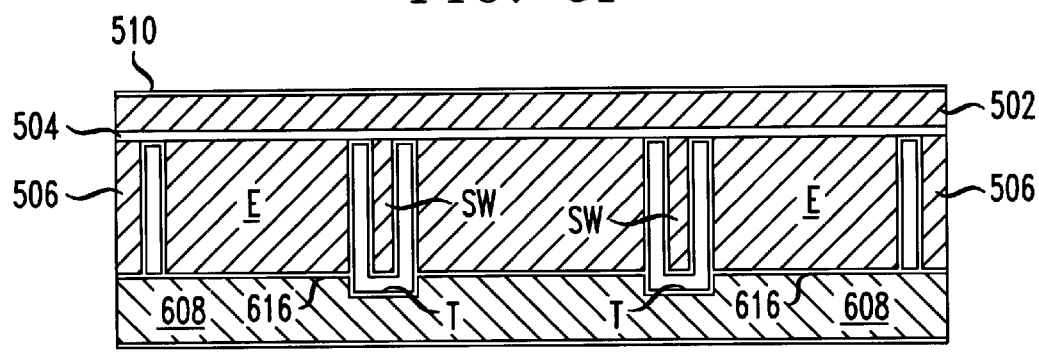

SOI wafer 500 and silicon wafer 608 are bonded together such that clearance trenches T are positioned directly underneath nascent side-walls SW, as depicted in FIG. 5F. For clarity of illustration, adjacent oxide layers 510 and 614 are depicted as a single oxide layer 616 in FIG. 5F and henceforth.

Figure 5G:
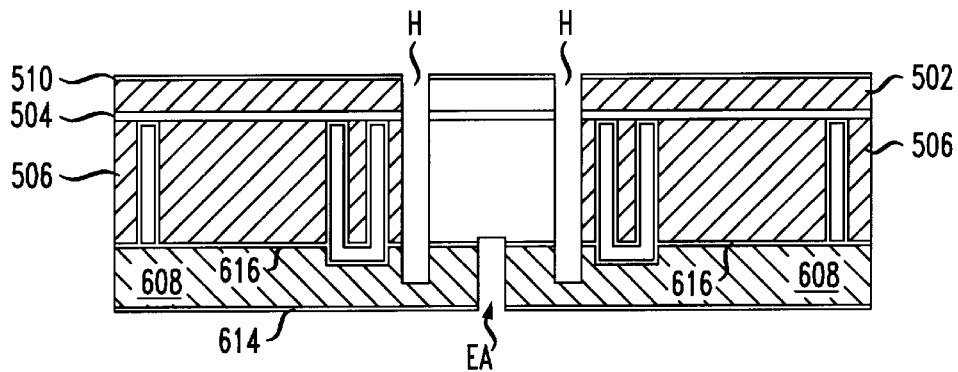

Top oxide layer 510 is patterned and then etched to form two holes H that are depicted in FIG. 5G. The holes advantageously extend completely through SOI wafer 500 and into underlying silicon wafer 608. Holes H define the location of the micro-tubes MT. Bottom oxide layer 614 is patterned and etched to form hole EA, which extends through oxide layer 616 into the thick silicon portion 506 of wafer 500. Hole EA will provide access for etchant in later steps.

Figure 5H:
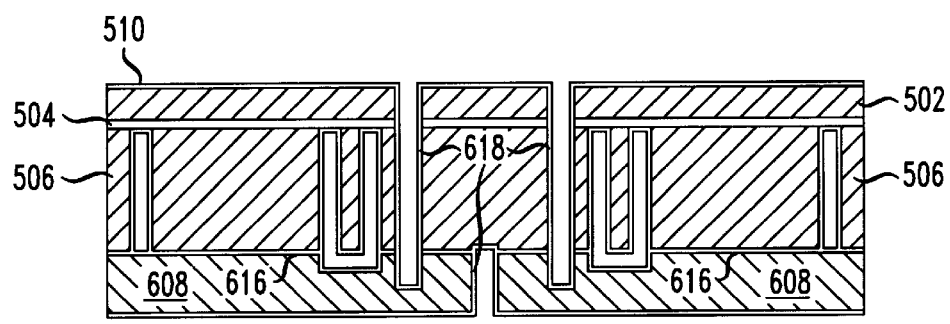
Figure 5I:
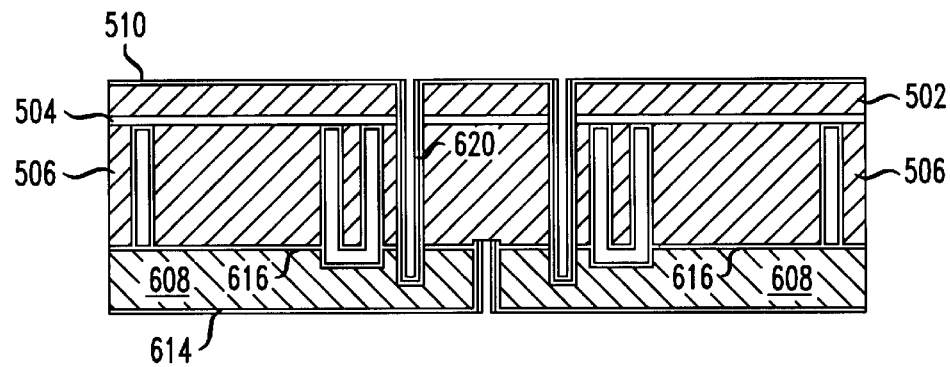

A layer of oxide 618 is grown/deposited in holes H and hole EA. Oxide layer 618 is depicted in FIG. 5H. With reference to FIG. 5I, oxide 618 is then removed from the "bottom" of hole EA (ie., the removed portion is that portion of the oxide layer of hole EA that is adjacent to thick silicon layer 506. A layer 620 of polysilicon, or other material suitable for forming the walls of a micro-tube as previously described, is deposited/grown in holes H. Layer thickness is typically about 1 micron, but may vary within a range and as a function of tube diameter as previously described. Layer 620 is doped to impart conductivity, if required.

Since the polysilicon, etc. will deposit over exposed surfaces, the top and bottom of the nascent XY translation stage are polished to remove it, stopping on top at oxide layer 510 and on bottom at oxide layer 614. Polysilicon, etc., that was deposited in hole EA while layer 620 was deposited in holes H will be removed in later steps.

Figure 5J:
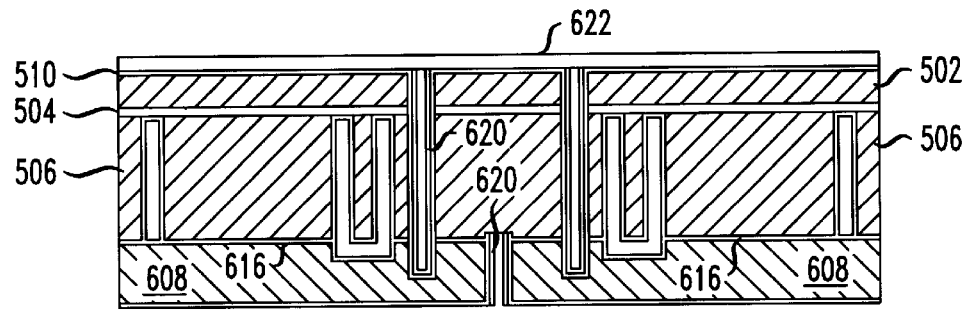

A layer 622 of resist or other protective material is deposited on the top surface (ie., layer 510). FIG. 5J depicts the layer 622. The nascent XY translation stage is then exposed to an isotropic etchant suitable for etching silicon, such as $XeF_2$.

Figure 5K:
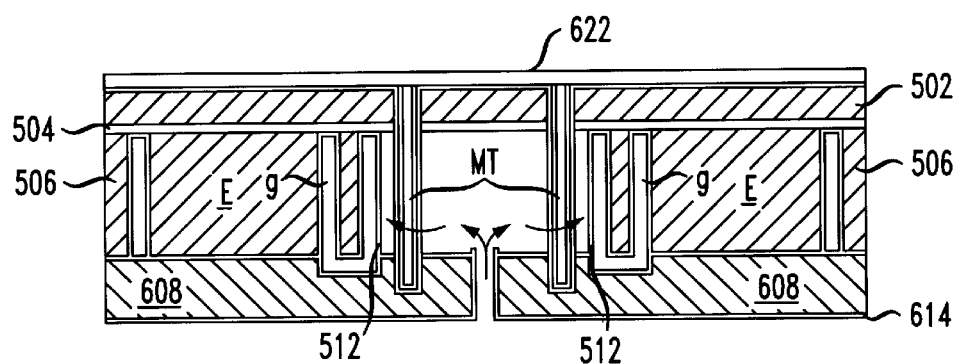

With holes H protected by layer 622, the silicon is accessed only via hole EA. As depicted in FIG. 5K, the etchant removes the thick silicon region 506 that surrounds nascent micro-tubes MT. The progress of the etchant in a lateral direction is stopped by oxide layer 512 that was deposited in trench 540. (See also FIGS. 5C and 5D.)

Figure 5L:
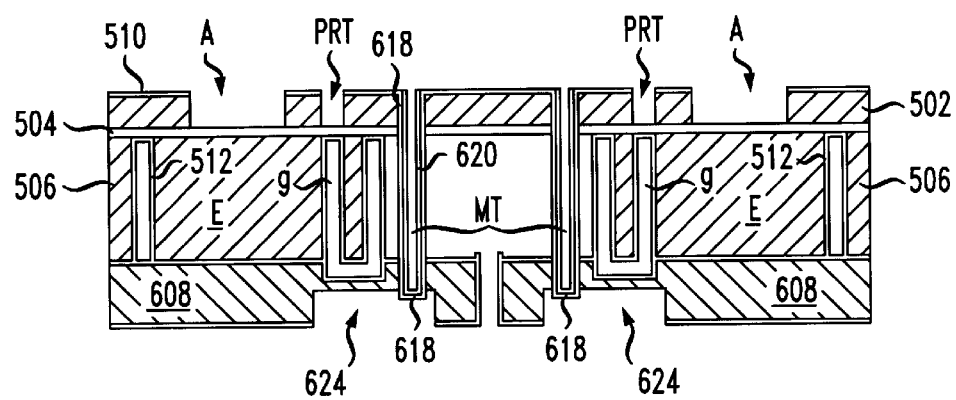

Layer 622 is stripped in known fashion, and the top layer (ie., layer 510) and bottom layer (i.e., layer 614) are patterned and etched. Referring to FIG. 5L, the patterning and etch steps produce, on top, openings A and opening or trench PRT. Openings A provide access to electrodes E after BOX layer 504 is removed, and trench PRT defines and facilitates the release of platform P of the XY translation table. On the bottom layer, the patterning and etch steps produces trench 624, which exposes the bottom portion of oxide layer 618 of the nascent micro-tubes MT.

Finally, oxide layers are stripped in known fashion to free platform P and to expose the top surface of electrodes E. This step substantially completes the fabrication of the XY translation table. FIG. 5N, which is a top view, and FIG. 5M, which is a cross section through FIG. 5N at the line 2—2, show the XY translation table in final form.

Figure 5M:
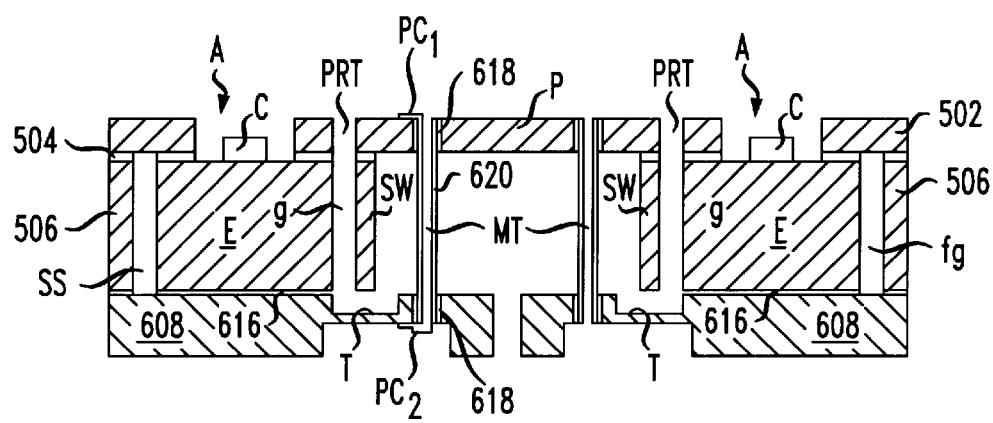
Figure 5N:
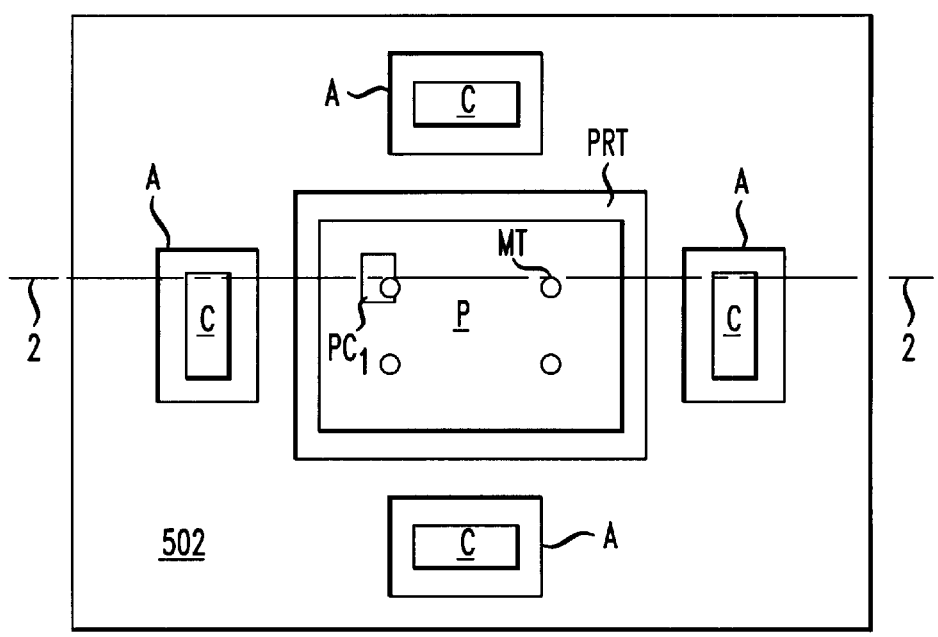

As depicted in FIGS. 5M and 5N, platform P is separated from surface substrate layer 502 by trench PRT and supported by micro-tubes MT. Side-walls SW are separated from electrodes E by gap g and contacts C (gold, etc.) provide electrical connection to electrodes E. The electrodes E are isolated from base layer 608 by oxide layer 616, from intermediate layer 506 by space gap fg, and from surface layer 502 by oxide layer 504.

Platform P is advantageously grounded by via contacts $PC_1$ and $PC_2$ that are deposited on at least one micro-tube MT. Moreover, after the side-walls SW are exposed when oxide layers are stripped, the side-walls SW are shorted to platform P (not depicted).

II. Array of Pedestal Mirrors

A. Structure and Operation

FIG. 6 depicts an illustrative array 700 of pedestal mirrors 701. Each illustrative pedestal mirror 701 comprises mirror M that is supported, near its center, by one micro-tube MT. The micro-tube MT is anchored in base layer 708.

While depicted as having a square shape, mirror M can have virtually any shape, as is suitable for the application or otherwise desired by the fabricator. The square shape depicted in FIG. 6 results in a very high "fill" factor for the array (i.e., there is very little space between adjacent mirrors). Each mirror is separated from adjacent mirrors via a space S.

Four electrodes E, only some of which are visible in FIG. 6, are disposed underneath each mirror M near the edges thereof. Mirrors M and the underlying electrodes E are separated by gap g. Electrodes E are electrically insulated from base layer 708 by a layer of electrically-insulating material (not depicted), such as, without limitation, silicon dioxide, etc. In other embodiments, fewer than four electrodes E may suitable be used. As described later in conjunction with an illustrative fabrication method of a pedestal mirror, electrical connection to electrodes E is provided from underneath base layer 708, as is access to the interior space of hollow micro-tubes MT.

In operation of array 700, voltage is applied across at least one electrode E and its associated overlying mirror M. The applied voltage generates an electrostatic force that draws a portion of the mirror downwardly toward the actuated electrode. Applying voltage to two adjacent electrodes will cause a mirror M to tilt across two axes.

Figure 7:
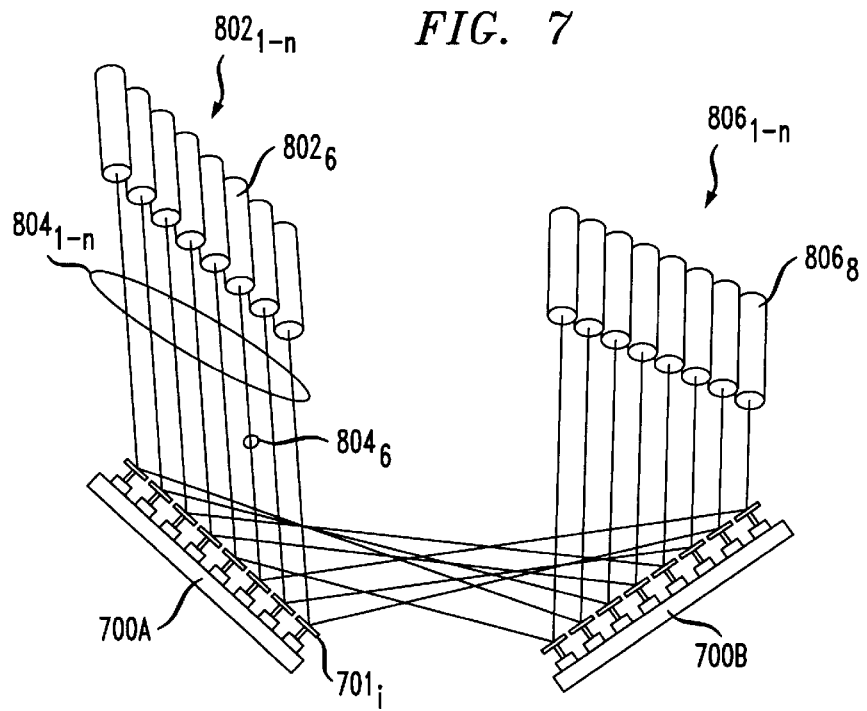
FIG. 7 depicts an array of pedestal mirrors functioning as an optical cross-connect in an optical communications system.

Each pedestal mirror 701 of array 700 is advantageously independently addressable so that each mirror can be moved, as desired, to direct an optical signal to a desired location. For example, array 700 can function as an optical cross-connect for rerouting optical signals in an optical communications system 800. A portion of illustrative optical communications system 800 is depicted in FIG. 7. For clarity of illustration, the mirror arrays shown in illustrative system 800 are depicted as 1×n arrays (i.e., one-dimensional arrays). It will be appreciated that in other embodiments, the mirror arrays are two-dimensional (e.g, m×n or n×n).

System 800 comprises a plurality of input waveguides $802_i$, i=1,n, (e.g., optical fibers, etc.) that are operable to deliver a plurality of optical signals $804_i$, i=1,n, to first mirror array 700A. Array 700A, which has a plurality of mirrors $701_i$, i=1,n, is operable to direct optical signals $804_i$ to the plurality of output waveguides $806_i$, i=1,n. Since each mirror 701 in array 700A is individually addressable, array 700A is capable of directing any of optical signals $804_i$, on an individual basis, to any output waveguide $806_i$. For example, in FIG. 7, optical signal $804_6$ from input waveguide $802_6$ is directed to output waveguide $806_8$. Thus, array 700A functions as an n×n switch.

As may be required as a function of waveguide aperture, etc., signals $804_i$ are advantageously directed from first mirror array 700A to second mirror array 700B before they are directed to output waveguides $806_i$. Second mirror array 700B is positioned so that optical signals $804_i$ received from first mirror array 700A are launched in to the output waveguides along the normal.

Collimating/focusing lenses (not shown) are advantageously used to collimate the optical signals leaving input waveguides $802_i$, i=1,n, and focus the optical signals entering output waveguides $806_i$, i=1,n.

In the illustrative embodiment, the number of input waveguides, n, equals the number of output waveguides, and equals the number of optical signals and equals the number of mirrors in the mirror array. In other embodiments, such numbers may be different. That is, there is no requirement that the number of input waveguides and output waveguides are equal to one another, or that the number of waveguides is equal to the number of optical signals, or that the number of optical signals is equal to the number of mirrors in the mirror array.

B. Tilt Angle as a Function of Applied Voltage

Figure 8:
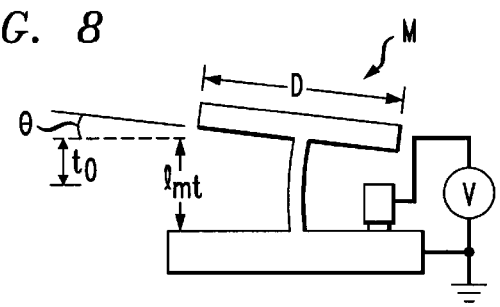
FIG. 8 depicts a figurative cross-sectional view of the illustrative tilting pedestal mirror of FIG. 6.

With reference to FIG. 8, which depicts a simplified cross-section of a pedestal mirror, the voltage requirement for tilting mirror M, assumed to be circular, by a specified angle θ is approximated by:

$$V^2 = 4.9 \times 10^5 (t_{mt} d_{mt}^3 \theta_c^3)/(l_{mt} D) \quad [4]$$

where: $l_{mt}$ is the height of the micro-tube;
$d_{mt}$ is the outer diameter of the micro-tube;
$t_{mt}$ is the wall thickness of the micro-tube;
$\theta_c$ is the "critical" tilt angle of the mirror, beyond which the system becomes unstable;
D is the diameter of mirror M;
distance (e.g., length, etc.) are measured in microns; and angle is measured in degrees.

$$\theta_c = (2/3)(t_o/D) \quad [5]$$

where: $t_o$ is the gap g between the mirror and electrode at zero volts.

For an illustrative case, it is assumed that:
height $l_{mt}$ of the micro-tube is 500 microns;
diameter $d_{mt}$ of the micro-tube is 15 microns;
wall thickness $t_{mt}$ of the micro-tube is 0.5 microns; and
diameter D of the mirror is 1000 microns.
Substituting such values, Expression [4] becomes:

$$V_c = 410 \theta_c^{3/2} \quad [6]$$

Table I lists voltage requirements as a function of critical tilt angle, and specifies the required zero voltage gap between the mirror and the electrode.

TABLE I

| $\theta_c$ <degrees> | $V_c$ <volts> | $t_o$ <microns> |
|---|---|---|
| 0.25 | 5 | 7 |
| 0.50 | 14 | 13 |
| 1.00 | 41 | 26 |
| 2.00 | 116 | 52 |
| 5.00 | 458 | 130 |

For comparison, if the micro-tube supporting the mirror were solid, then the activation voltage increases by a factor of: $[\frac{1}{8}(d_{mt}/t_{mt})]^{0.5}$ or 1.94.

C. Illustrative Fabrication Method

Figure 9A:
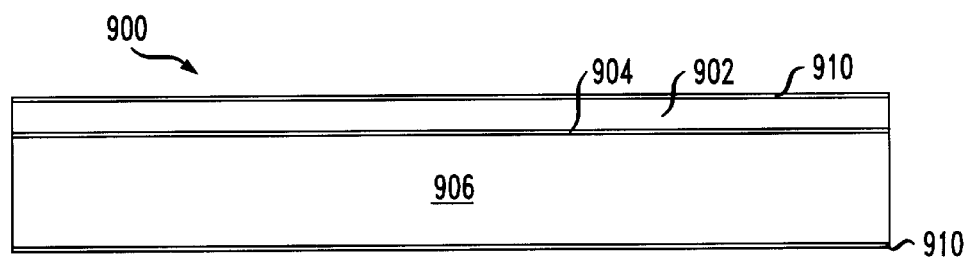
FIGS. 9A–9R depict stages in the fabrication of the illustrative tilting pedestal mirror of FIG. 6.
Figure 9B:
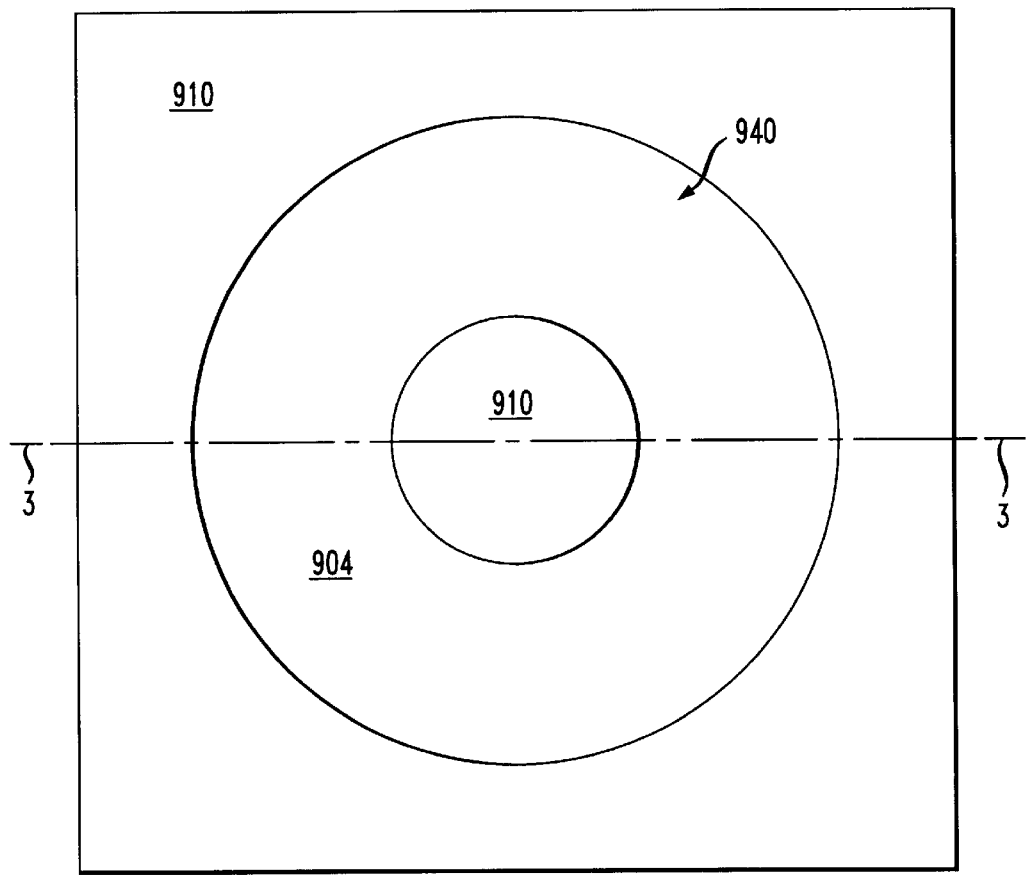
Figure 9C:
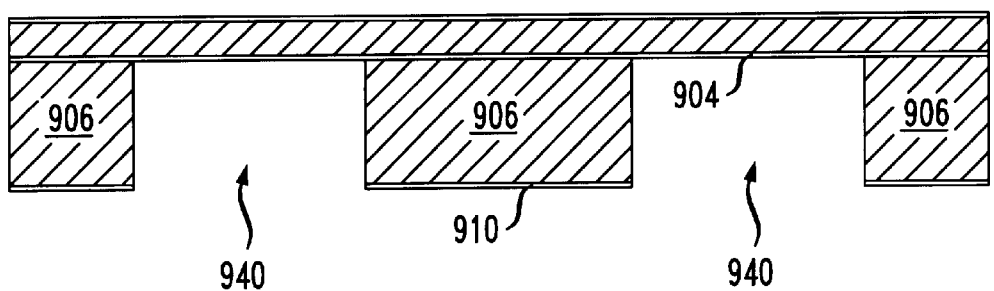
Figure 9D:
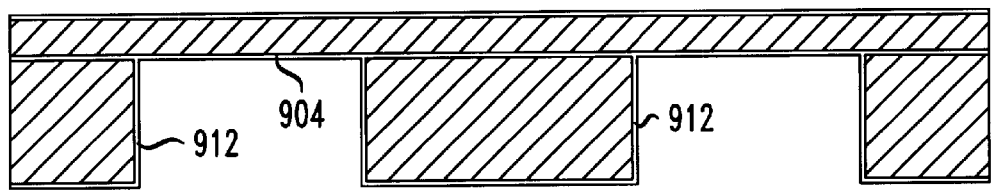
Figure 9E:
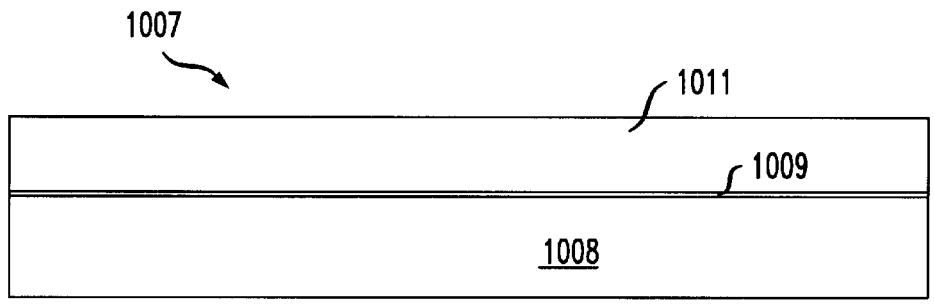
Figure 9F:
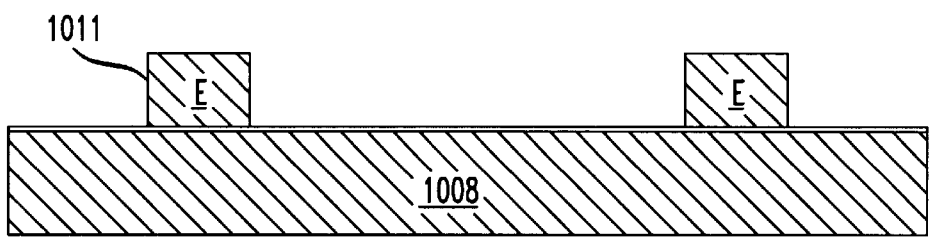
Figure 9G:
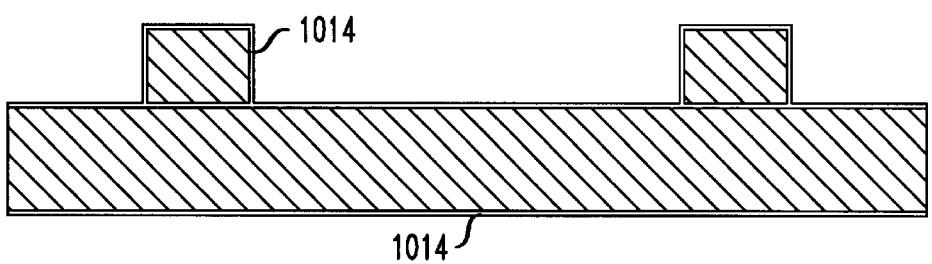
Figure 9H:
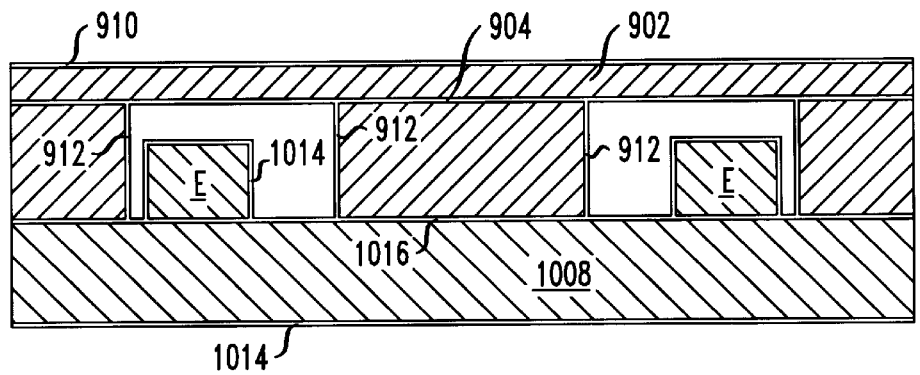
Figure 9I:
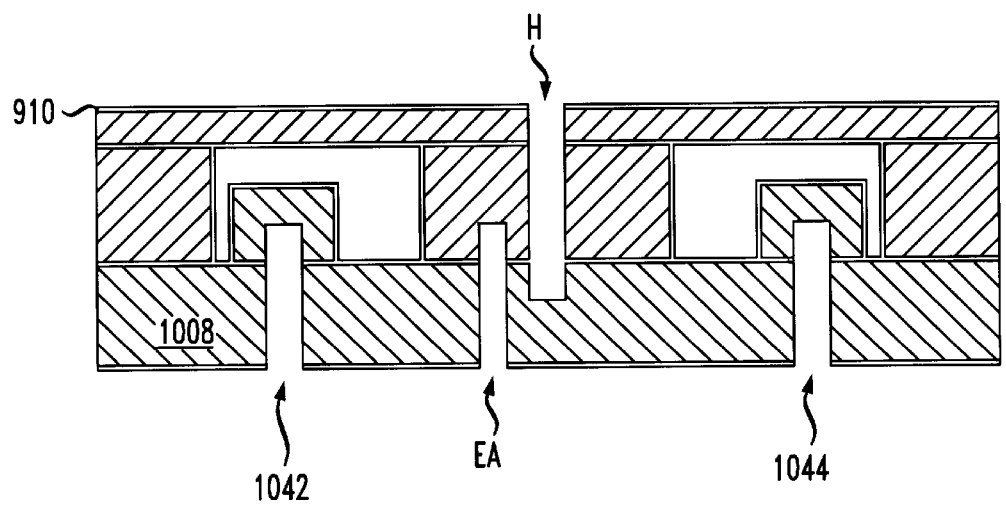
Figure 9J:
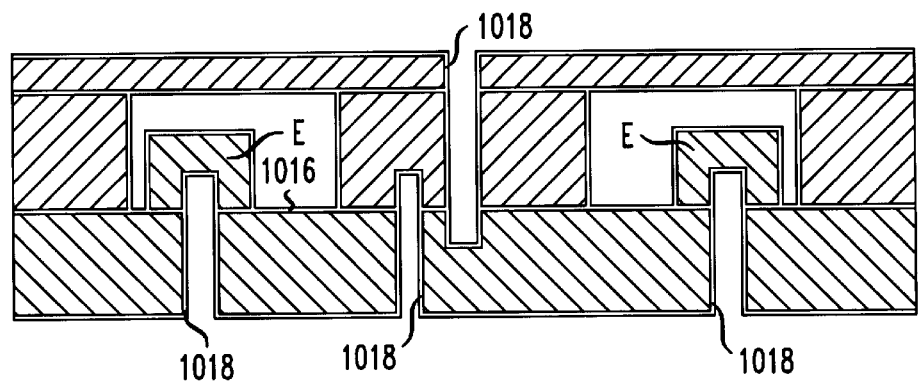
Figure 9K:
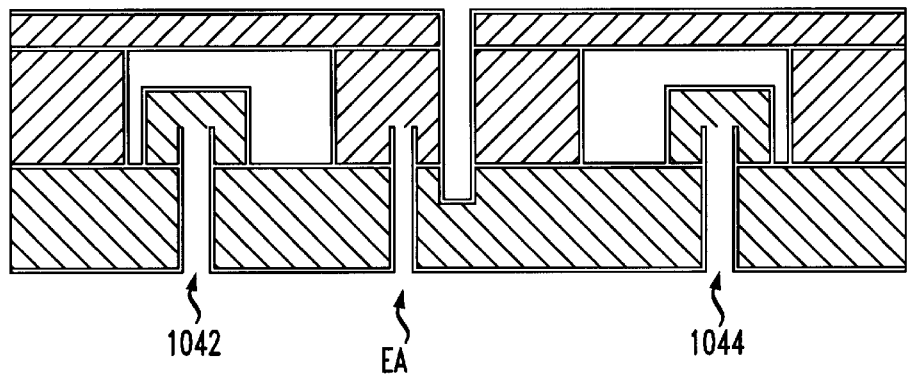
Figure 9L:
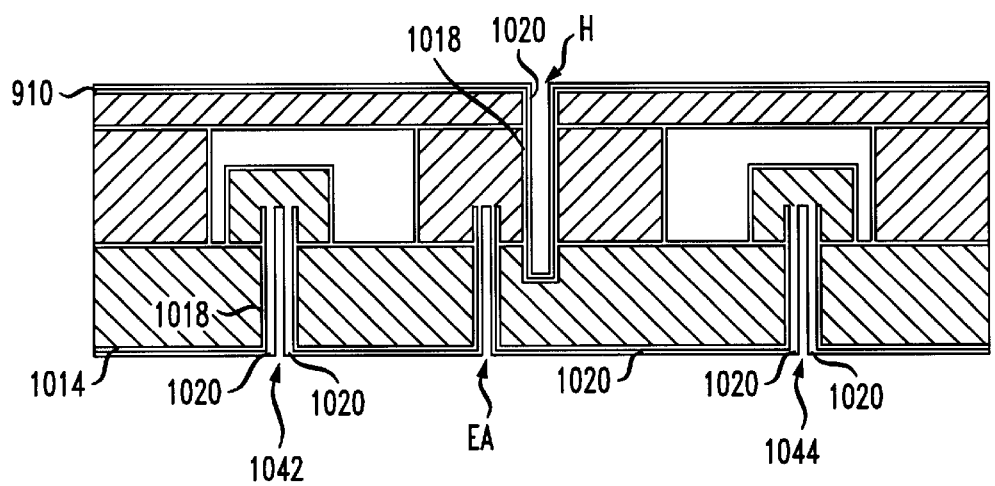
Figure 9M:
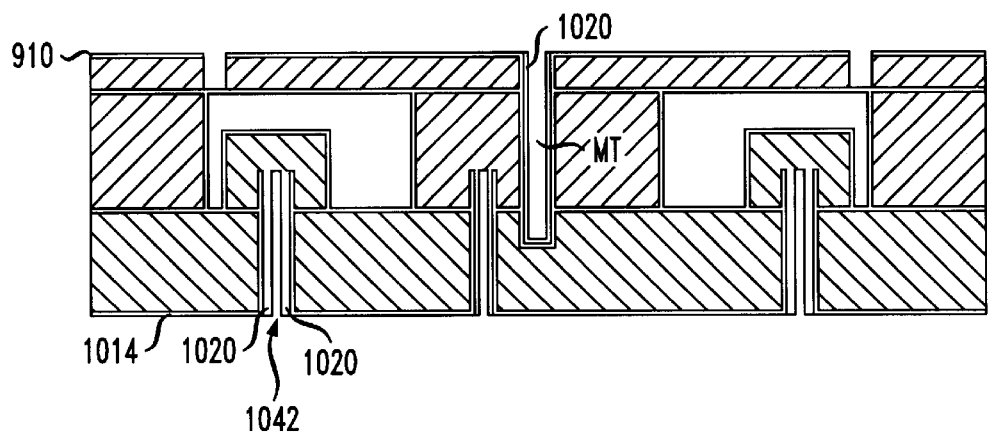
Figure 9N:
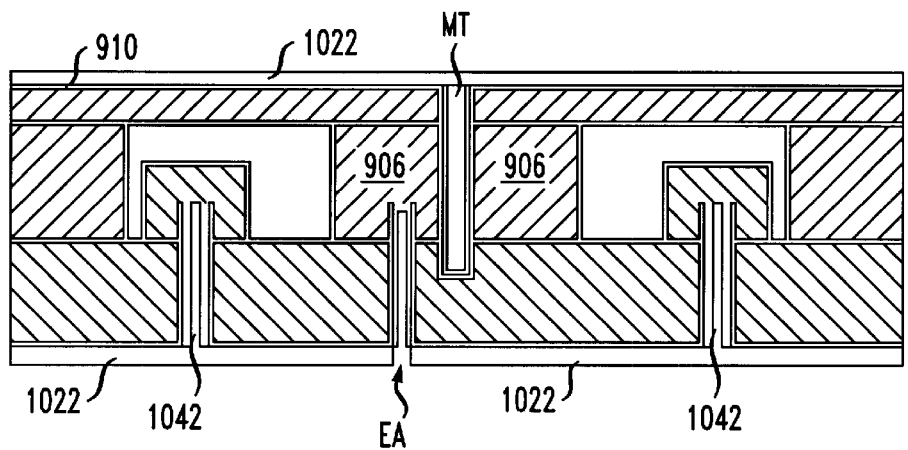
Figure 9O:
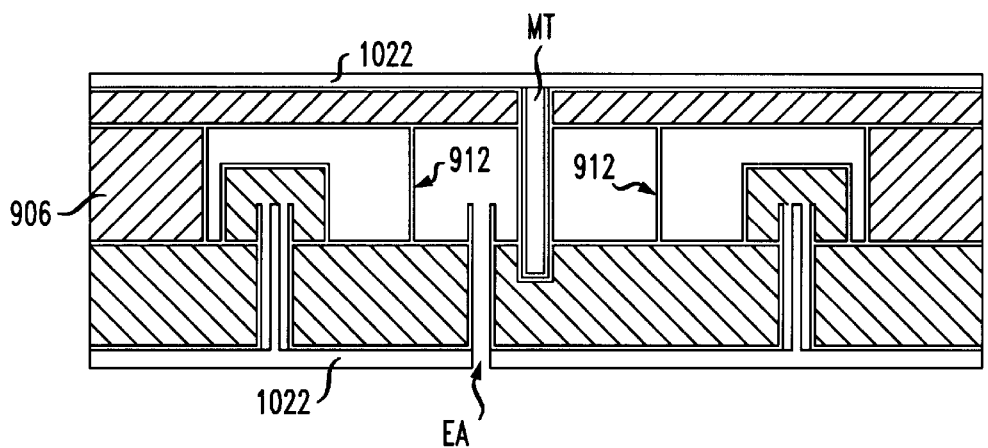
Figure 9P:
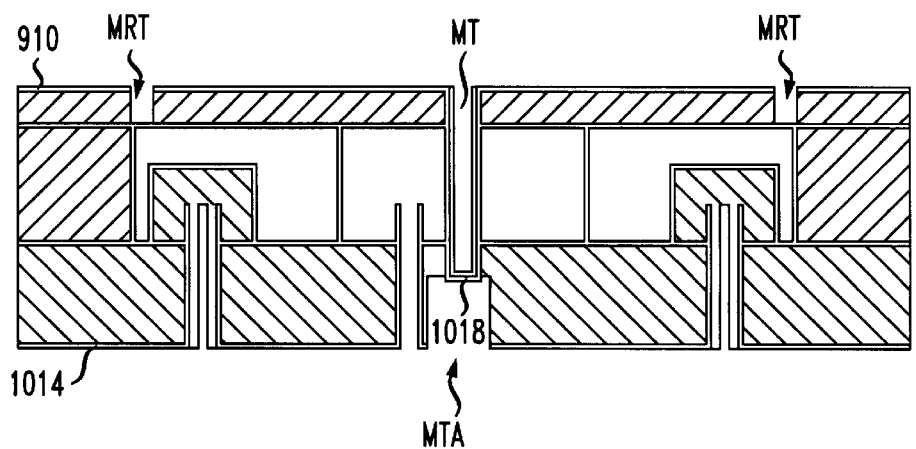
Figure 9Q:
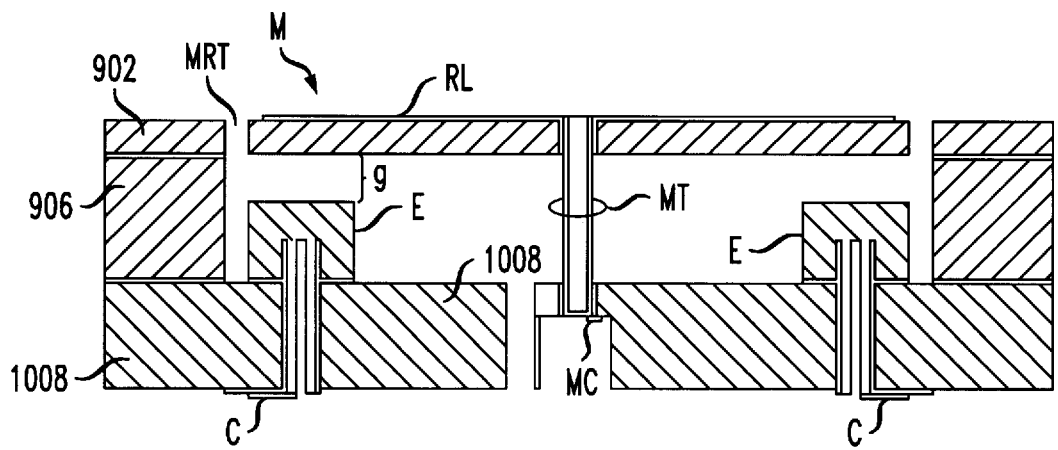

FIGS. 9A–9Q and the accompanying text provide a description of an illustrative fabrication method for a pedestal mirror, such as one of pedestal mirrors 701 depicted in array 700 of FIG. 6.

The fabrication method described below is based on method 200 for the fabrication of a micro-tube, as applied in the specific context of a pedestal mirror. In the embodiment described below, two different types of SOI wafers are used for fabrication.

FIG. 9A depicts first SOI wafer 900, which is like SOI wafer 500, previously described. SOI wafer 900 comprises "thick" silicon layer (i.e., "handle portion") 906, an electrically insulating layer 904 disposed thereon (e.g., "buried oxide layer" or "BOX layer", etc.), and "thin" silicon layer 902 that is disposed on insulating layer 904. A layer of oxide 910 is grown on the surface of silicon layers 902 and 906. The thickness of oxide layer 910 is not critical; a layer thickness in a range of about 10 microns to about 50 microns is suitable.

Oxide layer 910 on the handle side of wafer 900 is patterned and etched as depicted in FIG. 9B. In particular, circular trench 940 is etched down to BOX layer 904. FIG. 9C depicts a cross section of wafer 900 through line 3—3 of FIG. 9B. After etching, oxide layer 912, which is depicted in FIG. 9D, is grown/deposited on the sides of trench 940.

FIG. 9E depicts second SOI wafer 1007. SOI wafer 1007 comprises lower silicon layer 1008, BOX layer 1009 and upper silicon layer 1011. The upper and lower silicon layers of wafer 1007 are relatively thick. In fact, each silicon layer can be about as thick as a standard silicon wafer (ie., 500 to 700 microns), since wafer 1007 is fabricating by bonding two standard silicon wafers together and then polishing to a desired thickness. Such SOI wafers are commercially available from BCO of Northern Ireland.

Wafer 1007 is patterned and then etched, leaving two regions standing above BOX layer 1009. Those two regions, identified as "E" in FIG. 9F, will be two electrodes of the pedestal mirror. Oxide layer 1014, depicted in FIG. 9G, is grown/deposited on regions E.

Wafer 1007 and wafer 900 are bonded together, with nascent electrodes E fitting within trench 940. The bonded arrangement is depicted in FIG. 9H. For clarity, solid sections of structural material (e.g., silicon) will be shown "cross hatched" to distinguish such sections from void regions. To improve clarity, the relatively thin oxide/polysilicon layers will not be cross hatched.

The top and bottom of the bonded wafers are patterned and etch to form several holes, as depicted in FIG. 9I. In particular, hole H is formed through upper oxide layer 910 extending completely through SOI wafer 900 and into lower silicon layer 1008 of wafer 1007. Hole H defines the location of micro-tube MT. Bottom oxide layer 1014 is patterned and etched to form holes 1042 and 1044, which provide access to electrodes E. Hole EA is also formed through bottom oxide layer 1014. Hole EA, which extends through oxide layer 616 into thick silicon layer 906, provides access for etchant that will release micro-tube MT in later steps of the fabrication method.

A layer of oxide 1018 is grown/deposited in hole H and holes 1042 and 1044, and hole EA. Oxide layer 1018 is depicted in FIG. 9J. With reference to FIG. 9K, oxide 1018 is then removed from the "bottom" of holes 1042 and 1044 and the bottom of hole EA.

Referring now to FIG. 9L, a layer 1020 of polysilicon, or other material suitable for forming the walls of a micro-tube as previously described, is deposited/grown in hole H. Layer thickness is typically about 1 micron, but may vary within a range and as a function of tube diameter as previously described. Layer 1020 is doped to impart conductivity, if required.

With reference to FIG. 9M, since the polysilicon, etc. deposited in the previous step will deposit over any exposed surface, the top and bottom of the nascent pedestal mirror are polished to remove it, stopping on top at oxide layer 910 and on bottom at oxide layer 1014. Polysilicon, etc., that was deposited in hole EA will be removed in later steps.

A layer 1022 of resist or other protective material is deposited on the top surface (i.e., layer 910) and patterned, as depicted in FIG. 9N. The nascent Pedestal mirror is then exposed to an isotropic etchant suitable for etching silicon, such as $XeF_2$. With hole H and holes 1042 and 1044 protected by layer 1022, the silicon is accessed only via hole EA. As depicted in FIG. 9O, the etchant removes the thick silicon region 906 that surrounds nascent micro-tube MT. The progress of the etchant in a lateral direction is stopped by oxide layer 912 that was deposited in trench 540. (See also FIG. 9D.)

Layer 1022 is stripped in known fashion, and the top layer (ie., layer 910) and bottom layer (i.e., layer 1014) are patterned and etched. Referring to FIG. 9P, the patterning and etch steps produce, on top, opening or trench MRT. Trench MRT defines and facilitates the release of mirror M. On the bottom layer, the patterning and etch steps produces hole MTA, which exposes the bottom portion of oxide layer 1018 of the nascent micro-tubes MT.

Oxide layers are stripped in known fashion to free mirror M, and a reflection layer RL, such as a layer of gold, is deposited on top surface of mirror M. Contacts C (gold, etc.) are deposited to provide electrical connection to electrodes E through layer 1008. Mirror M is advantageously grounded by via contacts MC that are deposited on micro-tube MT.

Figure 9R:
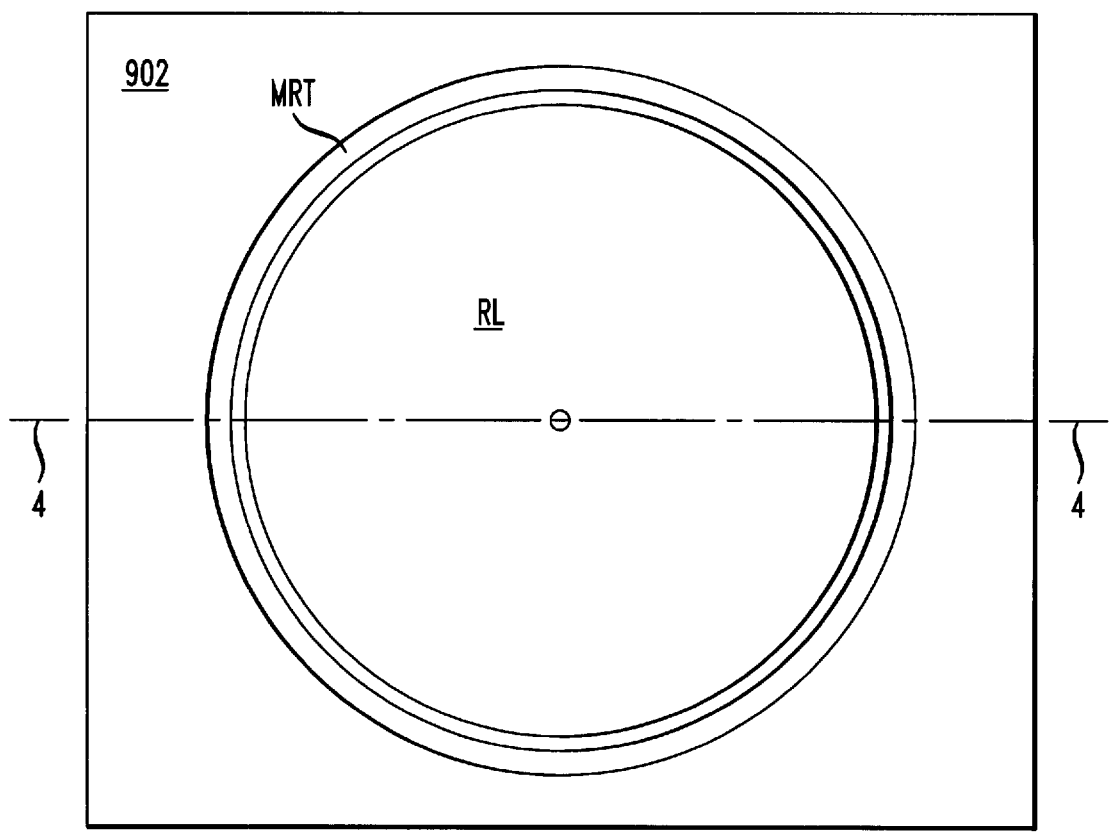

This substantially completes the fabrication of the pedestal mirror. FIG. 9R, which is a top view, and FIG. 5Q, which is a cross section through FIG. 5R at the line 4—4, show the pedestal mirror in final form. FIGS. 9Q and 9R depict mirror M separated from surface layer 902 by trench MRT and supported by micro-tube MT. Mirror M is separated from electrodes E by gap g.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. An article comprising:
   a base;
   a hollow shaft depending, at a first end thereof, from said base, wherein:
      said hollow shaft is defined by a wall; and
      said wall has a thickness that is less than about 5 microns; and
   a platform depending from a second end of said hollow shaft.

2. The article of claim 1 wherein said base comprises silicon.

3. The article of claim 2 wherein said silicon comprises a handle part of a silicon-on-insulator wafer.

4. The article of claim 1 wherein said wall is electrically conductive.

5. The article of claim 1 wherein said wall comprises polysilicon.

6. The article of claim 1 wherein said platform comprises silicon.

7. The article of claim 6 wherein said silicon comprises a thin silicon layer of a silicon-on-insulator wafer.

8. The article of claim 1 further comprising at least one electrode that is disposed on said base near said platform.

9. The article of claim 1 further comprising four electrodes that are disposed on said base near said platform.

10. The article of claim 8 further comprising a controlled voltage source that is electrically connected to said electrode.

11. The article of claim 1 wherein said platform is reflective, and further comprising at least one electrode disposed on said base beneath said platform.

12. The article of claim 11 wherein said hollow shaft and said platform depending therefrom collectively define a first pedestal mirror, said article further comprising a plurality of pedestal mirrors disposed on said base, wherein said first pedestal mirror and said plurality of pedestal mirrors are organized in an array.

13. The article of claim 12 wherein the article is an optical cross connect.

14. The article of claim 1 further comprising a first sidewall depending from said platform along a first edge thereof and projecting towards, but not touching, said base.

15. The article of claim 14 further comprising a first electrode disposed on said base but electrically insulated therefrom, wherein, a surface of said first electrode is disposed in opposed and spaced relation to said first sidewall.

16. The article of claim 15 further comprising:
   a second sidewall, third sidewall and fourth sidewall depending from said platform along respective second, third and fourth edges thereof, said second sidewall, third sidewall and fourth sidewall projecting towards, but not touching, said base; and
   a second electrode, third electrode and fourth electrode disposed on said base but electrically insulated therefrom, wherein:
      a surface of said second electrode is disposed in opposed and spaced relation to said second sidewall;
      a surface of said third electrode is disposed in opposed and spaced relation to said third sidewall; and
      a surface of said fourth electrode is disposed in opposed and spaced relation to said fourth sidewall.

17. An article comprising:
   a base;
   a hollow shaft depending, at a first end thereof, from said base, wherein:
      said hollow shaft is defined by a wall; and
      said wall comprises polysilicon; and
   a platform depending from a second end of said hollow shaft.

18. A method comprising:
   forming a hole in a substrate, said hole defining a cylindrical wall within said substrate;
   depositing material on said cylindrical wall to a thickness that is less than a radius of said hole;
   removing a portion of said substrate surrounding said cylindrical wall, thereby releasing a micro-tube depending, at a first end thereof, from said base; and
   positioning a platform to depend from a second end of said micro-tube.

19. The method of claim 18 wherein said step of forming comprises etching said hole using deep ion etching.

20. The method of claim 19 wherein said substrate comprises silicon-on-insulator.

21. The method of claim 18 wherein said material is polysilicon.

* * * * *